United States Patent [19]

Rumreich

[11] Patent Number: 5,760,729
[45] Date of Patent: Jun. 2, 1998

[54] FLASH ANALOG-TO-DIGITAL CONVERTER COMPARATOR REFERENCE ARRANGEMENT

[75] Inventor: Mark Francis Rumreich, Indianapolis, Ind.

[73] Assignee: Thomson Consumer Electronics, Inc., Indianapolis, Ind.

[21] Appl. No.: 432,522

[22] Filed: May 1, 1995

[51] Int. Cl.$^6$ ................................................. H03M 1/36
[52] U.S. Cl. ......................................................... 341/159
[58] Field of Search .................................. 341/159, 118, 341/158, 154, 156; 348/565

[56] References Cited

U.S. PATENT DOCUMENTS

| | | | |
|---|---|---|---|
| 4,496,935 | 1/1985 | Inoue et al. | 341/118 |
| 4,992,874 | 2/1991 | Willis et al. | 348/565 |
| 5,343,199 | 8/1994 | Sugawa | 341/159 |

OTHER PUBLICATIONS

Sanyo Fisher Service Corporation, TV Training Manual TV-013, "Introduction to Picture-In-Picture (PIP) Circuitry", pp. 6-7, published in 1992 in the USA.

*Primary Examiner*—Brian K. Young
*Attorney, Agent, or Firm*—Joseph S. Tripoli; Jospeh J. Laks; Marion P. Metelski

[57] ABSTRACT

A circuit reduces the total number of resistors needed to provide the reference voltages to the plurality of comparators in a flash analog-to-digital converter. In such a circuit, a first string of unit resistances having a first plurality of taps is coupled to a second string of unit resistances having first and second ends and a second plurality of taps between the ends. A first active device has an input coupled to a first tap of the first string of unit resistances and an output coupled to the first end of the second string of unit resistances. A second active device has an input coupled to a second tap of the first string of unit resistances and an output coupled to the second end of the second string of unit resistances.

17 Claims, 5 Drawing Sheets

1

FLASH ANALOG-TO-DIGITAL CONVERTER COMPARATOR REFERENCE ARRANGEMENT

BACKGROUND OF THE INVENTION

1. Field of the Invention

This invention relates generally to the field of analog-to-digital converters, and, in particular, to a circuit for providing reference voltages to the comparators of a flash analog-to-digital converter.

2. Background of the Invention

In the conversion of an analog voltage into an n-bit digital representation thereof, it is known to use a circuit configuration comprising a source of voltage potential; a network of resistors having a plurality of taps; a plurality of comparators connected in parallel; and, a decoder circuit. In this configuration, the source of voltage potential is applied across the resistor network to form a voltage divider. The voltage at each of the plurality of taps of the voltage divider is fed to the reference input of a different one of the plurality of comparators. The analog voltage is fed to the signal input of each of the comparators. When the analog voltage level at any comparator's signal input exceeds the voltage present at that comparator's reference input, the comparator's output switches from a "low" level to a "high" level. The decoding circuit provides the digital representation of the analog voltage on the basis of the comparators' outputs.

Since the comparators are connected in parallel, the quantization of the analog signal takes place immediately; however, this conversion speed is achieved at the cost of the number of components that are required. For example, a prior art n-bit analog-to-digital converter, shown in FIG. 5, requires $2^n$ comparators and $2^n$ resistors. Thus, a prior art 8-bit analog-to-digital converter requires 256 resistors and 256 comparators. Further resistors may be needed to divide the source of voltage potential so as to provide a desired dynamic range for the analog-to-digital converter. Referring again to FIG. 5, for a source of voltage potential $V_{DD}$ equal to 3.3 V and a desired dynamic range of approximately 1.0 V, a total of 589 additional resistors must be added to the resistor network, bringing the total number of resistors in the network to 845.

Each resistor in the network must be a "unit" resistor; that is, each resistor must be identical to the other resistors in order to maintain the accuracy of the voltage divider. If each of the resistors is identical, any change in the characteristics of any one resistor will be tracked by each of the other resistors despite variations in the source of voltage potential $V_{DD}$, the operating temperature, and the integrated circuit's fabrication process.

A problem with this method of biasing the plurality of comparators in the analog-to-digital converter concerns the amount of area needed to accommodate the unit resistor network in an integrated circuit. The size of each resistor is determined by the power that it is required to dissipate and by the tolerances inherent in the manufacturing process. When power dissipation is not a concern, the resistors can be the minimum size which meets the accuracy limitations of the manufacturing process. Since power dissipation is usually not the limiting factor, the manufacturing tolerances usually dictate the size of the resistor. Generally, at present, manufacturing tolerances prescribe that no dimension of an integrated circuit resistor shall be less than 10 microns.

Integrated circuit resistors include the polysilicon-type, with a typical resistivity of $30\Omega$ per square, and the diffusion-type, with a typical resistivity of $100\Omega$ per square. Referring once again to FIG. 5, each of the unit resistors in the resistor network is $1.5\Omega$ to provide the low output impedance required by the analog-to-digital converter. Keeping in mind that manufacturing tolerances dictate that no dimension of the resistor can be less than 10 microns, the smallest $1.5\Omega$ resistor would be a 10 micron by 200 micron polysilicon resistor. Thus, the area required on the integrated circuit for each resistor in the network is 0.002 mm$^2$, and the area required for the entire network of 845 resistors is 1.7 mm$^2$.

As the use of digital techniques becomes more prevalent, so does the need for analog-to-digital conversion. And as more integrated circuits employ multiple analog-to-digital converters, each requiring its own resistor network, it becomes more important to minimize the area occupied by each analog-to-digital converter's resistor network.

SUMMARY OF THE INVENTION

A circuit according to the inventive arrangements taught herein results in a reduction in the total number of resistors needed to provide the reference voltages to the plurality of comparators in a flash analog-to-digital converter. The area on an integrated circuit that is dedicated to an analog-to-digital converter can therefore be reduced.

Such a circuit comprises a source of voltage potential; a first string of unit resistances coupled across the source of voltage potential, the first string of unit resistances having a first plurality of taps; a second string of unit resistances, the second string having first and second ends and a second plurality of taps between the ends; a first active device having an input coupled to a first one of the first plurality of taps and an output coupled to the first end of the second string of unit resistances; and, a second active device having an input coupled to a second one of the first plurality of taps and an output coupled to the second end of the second string of unit resistances.

The circuit may comprise a plurality of comparators having a first set of respective inputs coupled to different ones of the second plurality of taps. The plurality of comparators may comprise a second set of respective inputs coupled to an analog voltage. The outputs of the plurality of comparators may be coupled to means for decoding the outputs of the plurality of comparators. The first and second active devices may comprise unity-voltage-gain current amplifiers. The second string of unit resistances compensates for variations in both the operating temperature and the source of voltage potential.

An analog-to-digital converter incorporating a circuit according to the inventive arrangements taught herein comprises a source of voltage potential having first and second terminals; a string of unit resistances, the string having first and second ends and a plurality of taps between the ends; a first unity-voltage-gain current amplifier having an input coupled to the first terminal of the source of voltage potential and an output coupled to the first end of the string of unit resistances; a second unity-voltage-gain current amplifier having an input coupled to the second terminal of the source of voltage potential and an output coupled to the second end of the string of unit resistances; a plurality of comparators having a first set of respective inputs coupled to different ones of the plurality of taps and a second set of respective inputs coupled to an analog voltage; means for decoding outputs of the plurality of comparators; and, means for providing a digital representation of the analog voltage.

A picture-in-picture processor incorporating a circuit according to the inventive arrangements taught herein comprises a source of a main video signal; a main sync detector for separating from the main video signal a main horizontal sync signal and a main vertical sync signal; a source of an auxiliary video signal; an auxiliary sync detector for separating from the auxiliary video signal an auxiliary horizontal sync signal and an auxiliary vertical sync signal; an analog-to-digital converter for the auxiliary video signal, the analog-to-digital converter including a source of voltage potential having first and second terminals, a string of unit resistances having first and second ends and a plurality of taps between the ends, a first active device having an input coupled to the first terminal of the source of voltage potential and an output coupled to the first end of the string of unit resistances, and a second active device having an input coupled to the second terminal of the source of voltage potential and an output coupled to the second end of the string of unit resistances; a memory for storing a digitized auxiliary video signal; means for reading the digitized auxiliary video signal from the memory synchronously with the main video signal; a digital-to-analog converter for the synchronized and digitized auxiliary video signal; and, a multiplexer for combining the synchronized main and auxiliary video signals.

DETAILED DESCRIPTION OF THE PREFERRED EMBODIMENTS

Figure 1:
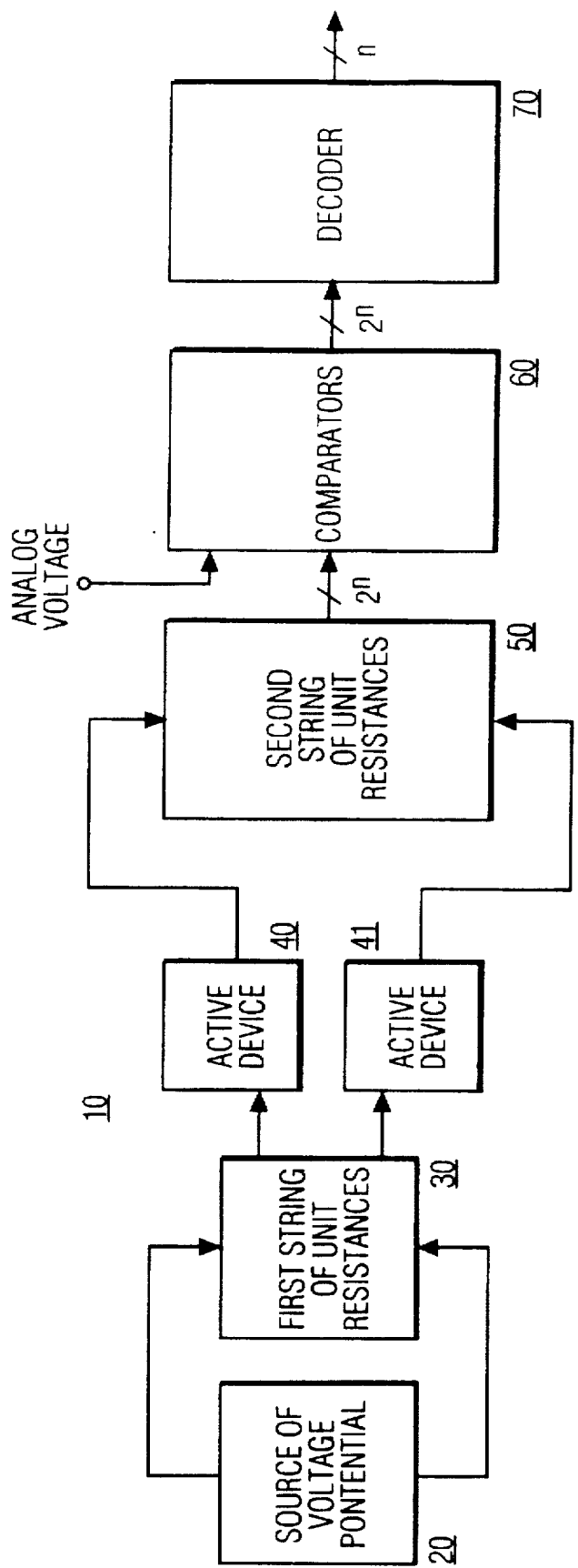
FIG. 1 is a block diagram of an n-bit analog-to-digital converter incorporating an inventive arrangement.

An n-bit analog-to-digital converter 10 according to an inventive arrangement is shown in FIG. 1. The analog-to-digital converter 10 comprises a source of voltage potential 20, a first string of unit resistances 30, a pair of active devices 40 and 41, a second string of unit resistances 50, a plurality of comparators 60, and a decoder 70.

A voltage provided by source 20 is divided by first string of unit resistances 30 to provide two voltages that are individually fed to the inputs of respective active devices 40 and 41, where a current provided by each voltage is amplified. The outputs of active devices 40 and 41 are then applied across second string of unit resistances 50, which provides $2^n$ reference voltages to comparators 60. Each of the plurality of comparators 60 compares its reference voltage to an analog voltage. The outputs of the plurality of comparators 60 are coupled to decoder 70, which produces an n-bit digital representation of the analog voltage.

Figure 2:
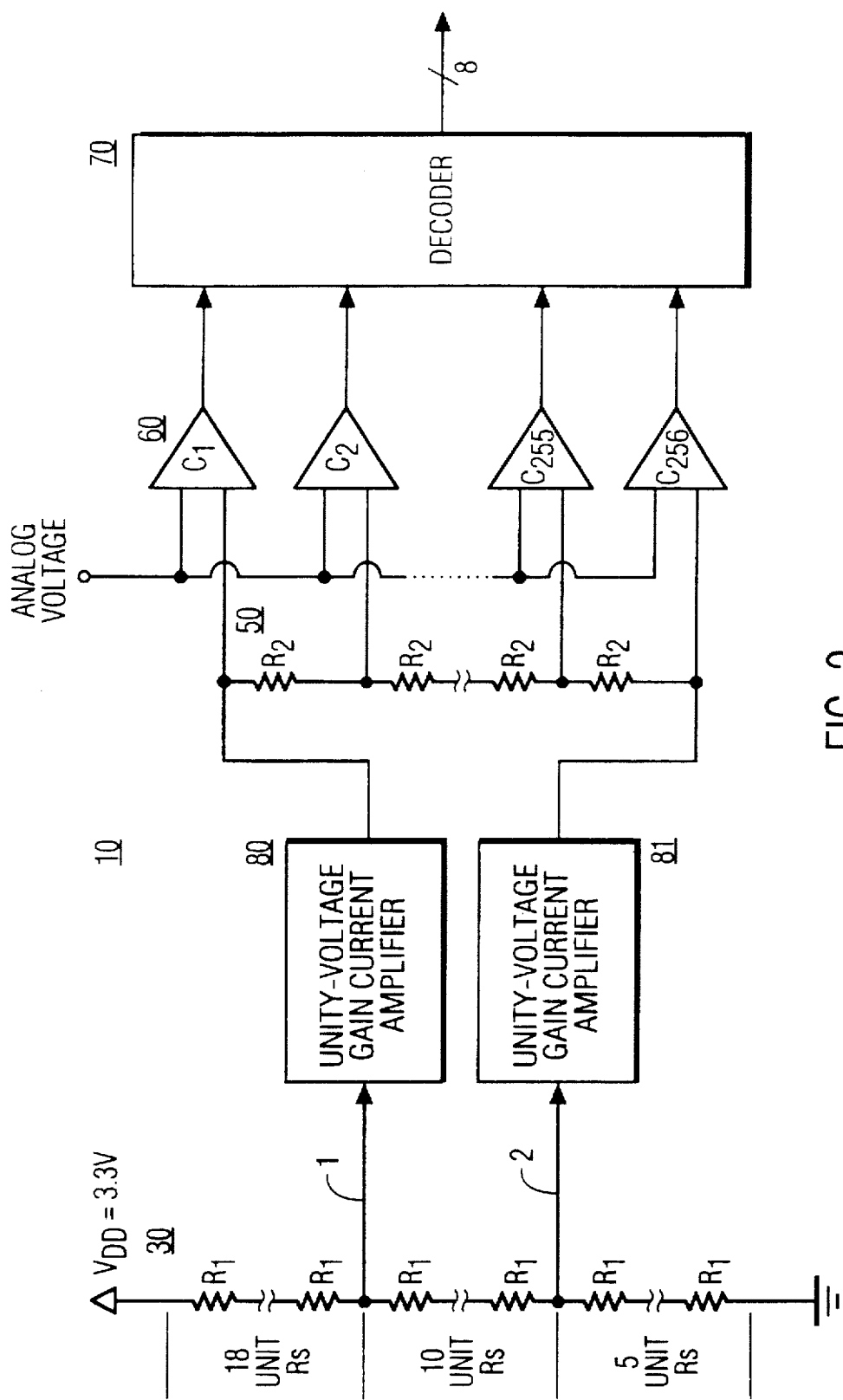
FIG. 2 is a schematic diagram of an 8 bit analog-to-digital converter incorporating an inventive arrangement.

A detailed schematic of analog-to-digital converter 10, using 8 bits, is shown in FIG. 2. Voltage source 20 supplies an external voltage $V_{DD}$ which is equal to 3.3.V.

Voltage $V_{DD}$ is applied across first string of unit resistances 30, which comprises a series interconnection of thirty-three first unit resistors $R_1$. First string of unit resistances 30 divides external voltage $V_{DD}$ into two different voltages at nodes 1 and 2, which are applied respectively to the inputs of unity-voltage-gain current amplifiers 80 and 81.

The number and value of first unit resistors $R_1$ comprising first string of unit resistances 30 is determined such that the voltage drop across second string of unit resistances 50 equals a required dynamic range at the input to the plurality of comparators 60, designated individually as $C_1$ through $C_{256}$, with the smallest number of first unit resistors $R_1$. In the analog-to-digital converter of FIG. 2, for example, a dynamic range of approximately 1.0 V is required. First string of unit resistances 30 is thus constructed to provide a voltage of $0.454V_{DD}$, or approximately 1.5 V, at node 1, which is the input to unity-voltage-gain current amplifier 80, and a voltage of $0.151V_{DD}$, or approximately 0.5 V, at node 2, which is the input to unity-voltage-gain current amplifier 81. The required dynamic range of approximately 1.0 V is thus achieved.

Each first unit resistor $R_1$ has a value of $1,000\Omega$. First unit resistors $R_1$ are identical to ensure that the characteristics of each first unit resistor $R_1$ track one another despite variations in external voltage $V_{DD}$, the operating temperature, and the integrated circuits fabrication process. Using a value of $1,000\Omega$ for first unit resistors $R_1$ greatly increases the impedance from external voltage $V_{DD}$ to ground and thereby allows analog-to-digital converter 10 to dramatically reduce its current consumption.

First unit resistors $R_1$ may be advantageously formed by diffusion because the diffusion process yields a $1,000\Omega$ resistor with the smallest dimensions. For example, with a resistivity of $100\Omega$ per square, a $1,000\Omega$ diffusion-type resistor has a length of 100 microns, a width of 10 microns, and, consequently, an associated area of $0.001$ mm$^2$. A $1,000\Omega$ polysilicon-type resistor, with a resistivity of $30\Omega$ per square, would have a length of 333 microns, a width of 10 microns, and an associated area of $0.0033$ mm$^2$.

Figure 3:
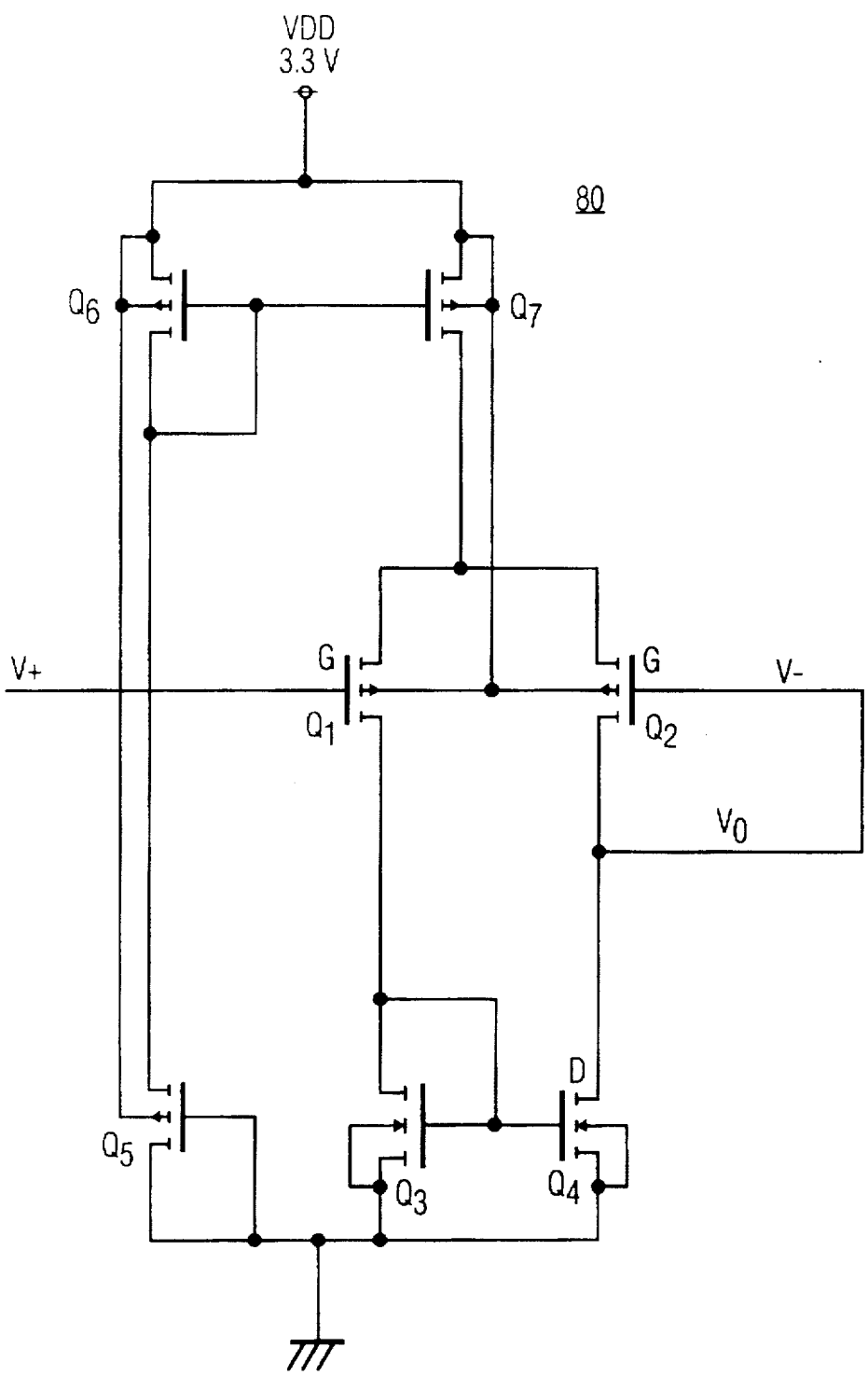
FIG. 3 is a schematic diagram of a unity-voltage-gain current amplifier which may be used in a presently preferred embodiment of the invention.

A schematic diagram of a suitable unity-voltage-gain current amplifier, for example amplifier 80, is shown in FIG. 3. This circuit is embodied as a CMOS differential amplifier having an inverting input $V_-$ at the gate of transistor Q2, a non-inverting input $V_+$ at the gate of transistor Q1, and an output $V_o$ taken at the drain of transistor Q4. The drain of transistor Q4 is tied to the gate of transistor Q2, thereby feeding back the output of the differential amplifier $V_o$ to its inverting input $V_-$. In this way the differential amplifier provides unity-voltage-gain with a low output impedance.

Referring again to FIG. 2, second string of unit resistances 50 comprises a series interconnection of two hundred and fifty-six second unit resistors $R_2$. Second string of unit resistances 50 divides the voltage drop across the outputs of unity-voltage-gain current amplifiers 80 and 81 to provide a plurality of reference voltages for the reference inputs of the plurality of comparators 60.

Each second unit resistor $R_2$ has a value of $1.5\Omega$ to provide the low output impedance needed by the analog-to-digital converter. Second unit resistors $R_2$ are identical to ensure that the characteristics of each of second unit resistors $R_2$ track one another despite variations in external voltage $V_{DD}$, the operating temperature, and the integrated circuit's fabrication process.

Second unit resistors $R_2$ may be advantageously formed from polysilicon because polysilicon yields a $1.5\Omega$ resistor with the smallest dimensions. For example, with a resistivity of $30\Omega$ per square, a $1.5\Omega$ polysilicon-type resistor has a length of 10 microns, a width of 200 microns, and, consequently, an associated area of $0.002$ mm$^2$. A $1.5\Omega$ diffusion-type resistor, with a resistivity of $100\Omega$ per square, would have a length of 10 microns, a width of 667 microns, and an associated area of $0.0067$ mm$^2$.

The total area associated with the resistors in the presently preferred embodiment is approximately 0.53 mm², and the size of the two unity-voltage-gain current amplifiers used in the presently preferred embodiment is negligible, for practical purposes, as compared to the size of the resistors replaced by those amplifiers. The presently preferred embodiment therefore provides a reduction in area of more than 1.1 mm² over prior art circuits without sacrificing the benefits of tracking the variations in external voltage $V_{DD}$, the operating temperature, the integrated circuit's fabrication process, and the like. The reduction in area becomes more pronounced and more significant as the number of analog-to-digital converters per integrated circuit is increased.

Each of the plurality of reference voltages of second string of unit resistances 50 is applied to a reference input of a different one of comparators 60. An analog voltage is applied to a signal input of each one of comparators 60. When the analog voltage at the signal input of one of comparators 60 exceeds that comparator's reference voltage, the output of that comparator switches from a "low" level to a "high" level. The outputs of comparators 60 are coupled to decoder 70, where the outputs of comparators 60 are translated into an n-bit digital word.

Figure 4:
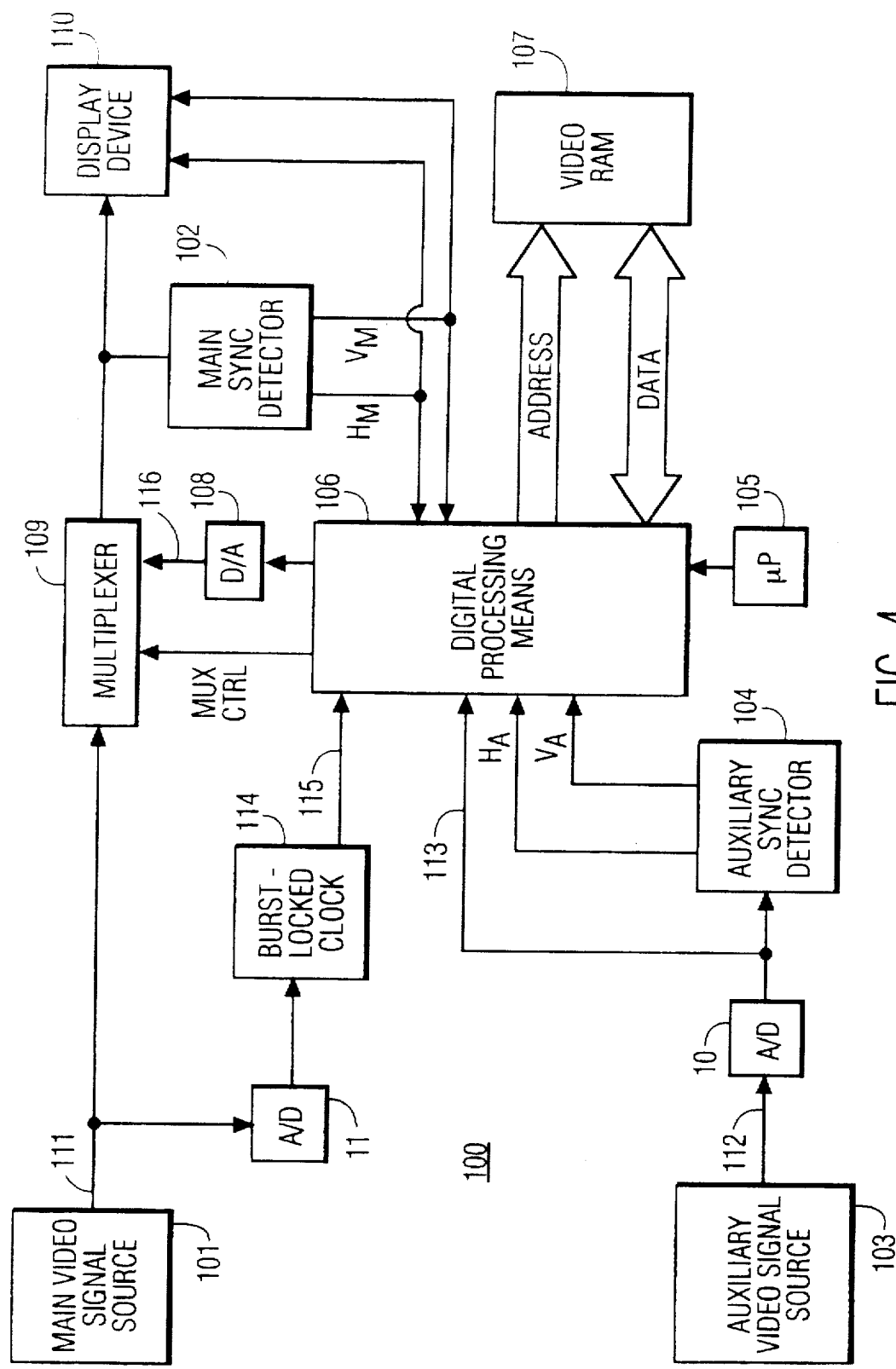
FIG. 4 is a block diagram of a television receiver incorporating an inventive arrangement.
Figure 5:
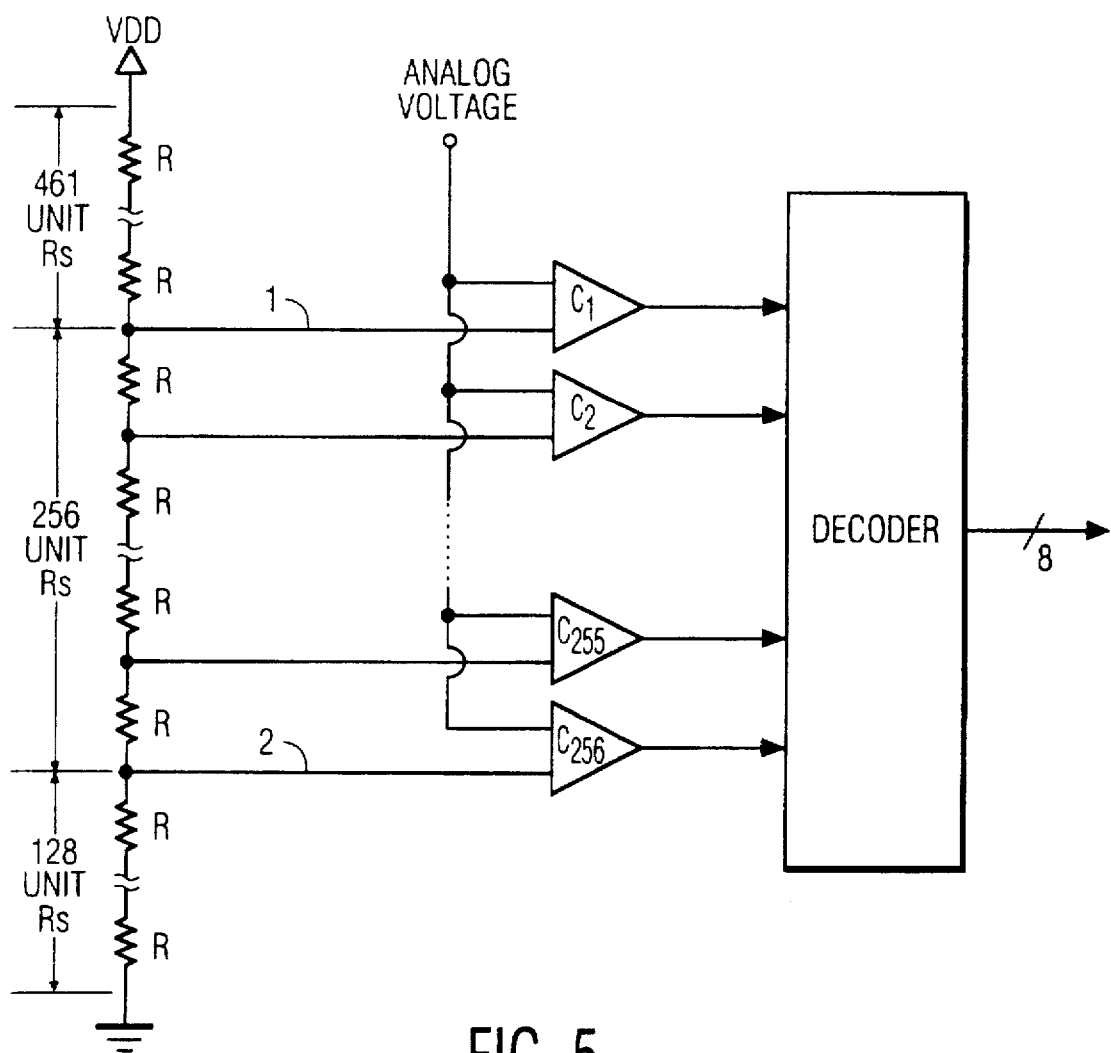
FIG. 5 is a schematic diagram of a prior art analog-to-digital converter.

A block diagram of a television receiver 100 incorporating analog-to-digital converters 10 and 11, and having picture-in-picture or picture-outside-picture capability, is shown in FIG. 4. Television receiver 100 includes a main video signal source 101 and an auxiliary video signal source 103, each of which comprises a tuner, an IF amplifier, and a video detector for producing, respectively, main video signal 111 and auxiliary video signal 112. Auxiliary video signal 112 is also coupled to a first analog-to-digital converter 10, which provides digitized auxiliary video signal 113.

Main horizontal sync signal $H_M$ and main vertical sync signal $V_M$ are separated from main video signal 111 by main sync detector 102. Likewise, auxiliary horizontal sync signal $H_A$ and auxiliary vertical sync signal $V_A$ are separated from auxiliary video signal 112 by auxiliary sync detector 104.

Video RAM 107 is used to appropriately synchronize main video signal 111 with auxiliary video signal 112 to produce a stable auxiliary video signal 116. Main video signal 111 is coupled to a second analog-to-digital converter 10. The output of second analog-to-digital converter 10 is coupled to burst-locked clock 114, which provides clock signal 115 to digital processing means 106. Microprocessor 105 controls digital processing means 106, which receives sync signals $H_M$, $V_M$, $H_A$, and $V_A$, and digitized auxiliary video signal 113 as inputs. Digital processing means 106 writes digitized auxiliary video signal 113 into video RAM 107 synchronously with auxiliary sync signals $H_A$ and $V_A$. Digital processing means 106 then reads from video RAM 107 those digitized auxiliary video signals 113 that were previously stored therein. Reading occurs synchronously with main sync signals $H_M$ and $V_M$.

As data is read from video RAM 107 it is sent from digital processing means 106 to digital-to-analog converter 108, where it is converted into stable auxiliary video signal 116 and provided to an input of multiplexer 109. Another input of multiplexer 109 accepts main video signal 111. When multiplexer control signal MUX CTRL of digital processing circuit 106 is a "high" level, multiplexer 109 allows main video signal 111 to pass through to display device 110. When multiplexer control signal MUX CTRL of digital processing means 106 is a "low" level, multiplexer 109 allows stable auxiliary video signal 116 to pass through to display device 110.

Having described a presently preferred embodiment of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A circuit, comprising:
   a source of voltage potential;
   a first string of unit resistances coupled across said source of voltage potential, said first string providing an impedance of at least 1 kΩ said first string of unit resistances further having a first plurality of taps;
   a second string of unit resistances, said second string having first and second ends and a second plurality of taps between said ends;
   a first active device having an input coupled to a first one of said first plurality of taps and an output coupled to said first end of said second string of unit resistances; and,
   a second active device having an input coupled to a second one of said first plurality of taps and an output coupled to said second end of said second string of unit resistances.

2. A circuit according to claim 1, wherein said first and second active devices comprise unity-voltage-gain current amplifiers.

3. A circuit according to claim 1, wherein said first string of unit resistances is formed by diffusion.

4. A circuit according to claim 1, wherein said second string of unit resistances compensates for variations in operating temperature.

5. A circuit according to claim 1, wherein said second string of unit resistances compensates for variations in said source of voltage potential.

6. A circuit according to claim 1, further comprising a plurality of comparators having a first set of respective inputs coupled to different ones of said second plurality of taps.

7. A circuit according to claim 6, wherein said comparators have a second set of respective inputs coupled to an analog voltage.

8. A circuit according to claim 7, further comprising means for decoding outputs of said plurality of comparators.

9. A circuit according to claim 8, wherein said decoding means provides a digital representation of said analog voltage.

10. A flash analog-to-digital converter, comprising:
    a source of voltage potential having first and second terminals;
    a string of unit resistances, said string having first and second ends and a plurality of taps between said ends;
    a first unity-voltage-gain current amplifier having an input coupled to said first terminal of said source of voltage potential and an output coupled to said first end of said string of unit resistances;
    a second unity-voltage-gain current amplifier having an input coupled to said second terminal of said source of voltage potential and an output coupled to said second end of said string of unit resistances;
    a plurality of comparators having a first set of respective inputs coupled to different ones of said plurality of taps and a second set of respective inputs coupled to an analog voltage;

means for decoding outputs of said plurality of comparators; and, means for providing a digital representation of said analog voltage.

11. A flash analog-to-digital converter according to claim 10, wherein said string of unit resistances is formed from polysilicon.

12. A flash analog-to-digital converter according to claim 10, wherein said string of unit resistances is formed by diffusion.

13. A flash analog-to-digital converter, comprising:

a first string of unit resistances having first and second taps, said first string providing an input impedance for said analog-to-digital converter;

a second string of unit resistances having first and second ends and a plurality of taps between said ends, wherein a unit resistance of said second string has a resistance value that is substantially less than the resistance value of a unit resistance of said first string, said second string providing an output impedance for said analog-to-digital converter;

a first active device having an input coupled to said first tap of said first string and an output coupled to said first end of said second string; and, and a second active device having an input coupled to said second terminal of said source of voltage potential and an output coupled to said second end of said string of unit resistances; and, a second active device having an input coupled to said second tap of said first string and an output coupled to said second end of said second string;

said input impedance of said analog-to-digital converter being substantially greater than said output impedance.

14. An analog-to-digital converter according to claim 13, wherein each of said resistances of said first string of unit resistances has a resistance value that is at least 1 k$\Omega$.

15. A flash analog-to-digital converter according to claim 13, wherein said first and second active devices of said analog-to-digital converter comprise unity-voltage-gain current amplifiers.

16. A flash analog-to-digital converter according to claim 13, wherein said second string of unit resistances of said analog-to-digital converter is formed from polysilicon.

17. A flash analog-to-digital converter according to claim 13, wherein said first string of unit resistances of said analog-to-digital converter is formed by diffusion.

* * * * *